(12) United States Patent
Lee et al.

(10) Patent No.: US 9,419,025 B2
(45) Date of Patent: Aug. 16, 2016

(54) DISPLAY DEVICE

(75) Inventors: Seong Young Lee, Anyang-si (KR);
Kyoung Tai Han, Asan-si (KR);
Kyung-Suk Jung, Iksan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 682 days.

(21) Appl. No.: 13/474,352

(22) Filed: May 17, 2012

(65) Prior Publication Data

US 2013/0161624 A1    Jun. 27, 2013

(30) Foreign Application Priority Data

Dec. 23, 2011    (KR) .......................... 10-2011-0141226

(51) Int. Cl.
*H01L 29/04*    (2006.01)
*H01L 29/10*    (2006.01)
*H01L 31/00*    (2006.01)
*H01L 27/12*    (2006.01)

(52) U.S. Cl.
CPC ................................. *H01L 27/1244* (2013.01)

(58) Field of Classification Search
USPC ................. 257/59, 88, 72, E33.053, E33.071, 257/E21.158; 438/29, 30; 349/42, 110, 156
See application file for complete search history.

(56) References Cited

U.S. PATENT DOCUMENTS

| | | | |
|---|---|---|---|
| 6,493,048 B1 | 12/2002 | Baek et al. | |
| 7,501,297 B2 | 3/2009 | Kim et al. | |
| 7,760,281 B2 | 7/2010 | Tanabe et al. | |
| 2009/0180044 A1 | 7/2009 | Kim et al. | |
| 2010/0033646 A1* | 2/2010 | Baek et al. | ....................... 349/42 |
| 2010/0140062 A1* | 6/2010 | Hopkins | ................ 200/61.45 R |

FOREIGN PATENT DOCUMENTS

| | | |
|---|---|---|
| JP | 06-347825 | 12/1994 |
| KR | 1020050019278 | 3/2005 |
| KR | 1020050079142 | 8/2005 |
| KR | 1020060079667 | 7/2006 |
| KR | 100671521 | 1/2007 |
| KR | 1020070109603 | 11/2007 |

* cited by examiner

*Primary Examiner* — Meiya Li
(74) *Attorney, Agent, or Firm* — H.C. Park & Associates, PLC

(57) ABSTRACT

The present invention relates to a display device, which includes a substrate; a first conductive layer disposed on the substrate and including a first terminal; a first insulating layer disposed on the first conductive layer; a second conductive layer disposed on the first insulating layer and including a second terminal; a second insulating layer disposed on the second conductive layer; a profile relieving member disposed on the second insulating layer; and a contact assistant disposed on the profile relieving member, in which the profile relieving member covers a portion of an edge of at least one of the first terminal and the second terminal.

22 Claims, 21 Drawing Sheets

DISPLAY DEVICE

CROSS-REFERENCE TO RELATED APPLICATION

This application claims priority to and the benefit of Korean Patent Application No. 10-2011-0141226 filed on Dec. 23, 2011, the entire contents of which are incorporated herein by reference.

BACKGROUND

1. Field

Exemplary embodiments of the present invention relate to a display device.

2. Discussion of the Background

In general, a display device may include a plurality of pixels as a unit to display an image, and a plurality of drivers. The drivers may include a data driver to apply a data voltage to a pixel, and a scan driver to apply a gate signal controlling transmission of the data voltage. Conventionally, a method in which the scan driver and the data driver are mounted on a printed circuit board (PCB) as a chip type and connected to the display panel, or mounted to the display panel, is generally used. However, recently, in a case of a scan driver that may not use high mobility of the thin film transistor channel, a structure in which the scan driver is not formed as an additional chip and is integrated with the display panel has been developed.

This scan driver may include electrical elements such as a plurality of transistors and a plurality of capacitors, and each electric element includes at least one conductive layer. The electric element included in the driver or the electric element of the driver and an input/output terminal may be electrically connected to each other through a connection. The connection may include a contact assistant connecting conductive layers of different layers of two connected elements, or the element and the terminal, or two terminals. If a high current or a current above a reference threshold flows to the contact assistant or resistance of the contact assistant is large or above a reference value, power may be increased such that heat may be generated and the contact assistant may be at risk of being disconnected. Further, this risk of defect may be generated in various connections of the display panel as well as the driver, and may not be limited to the contact assistant.

The above information disclosed in this background section is provided for enhancement of understanding of the background of the invention and therefore it may contain information that may not be prior art that is already known in this country to a person of ordinary skill in the art.

SUMMARY

Exemplary embodiments of the present invention provide a display device and a method for reducing a likelihood of a defect in one or more connections.

Additional features of the invention will be set forth in the description which follows, and in part will be apparent from the description, or may be learned by practice of the invention.

Exemplary embodiments of the present invention provides a display device including a substrate; a first conductive layer disposed on the substrate and including a first terminal; a first insulating layer disposed on the first conductive layer; a second conductive layer disposed on the first insulating layer and including a second terminal; a second insulating layer disposed on the second conductive layer; a profile relieving member disposed on the second insulating layer; and a contact assistant disposed on the profile relieving member, in which the profile relieving member covers a portion of at least one of the first terminal and the second terminal.

Exemplary embodiments of the present invention provides a display device including a substrate; a gate layer disposed on the substrate and including a gate terminal; a gate insulating layer disposed on the gate layer; a data layer disposed on the gate layer and including a data terminal; a lower passivation layer disposed on the data layer; a profile relieving member disposed on the lower passivation layer; and a contact assistant disposed on the profile relieving member, in which the profile relieving member covers an edge of the gate terminal and the data terminal.

Exemplary embodiments of the present invention provide a display device including a substrate; a gate layer disposed on the substrate and including a gate terminal; a gate insulating layer disposed on the gate layer; a data layer disposed on the gate layer and including a data terminal; a lower passivation layer disposed on the data layer; a profile relieving member disposed on the lower passivation layer; and a contact assistant disposed on the profile relieving member, in which the profile relieving member covers a portion of at least one of the gate terminal and the data terminal.

It is to be understood that both the foregoing general description and the following detailed description are exemplary and explanatory and are intended to provide further explanation of the invention as claimed. Other features and aspects will be apparent from the following detailed description, the drawings, and the claims.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
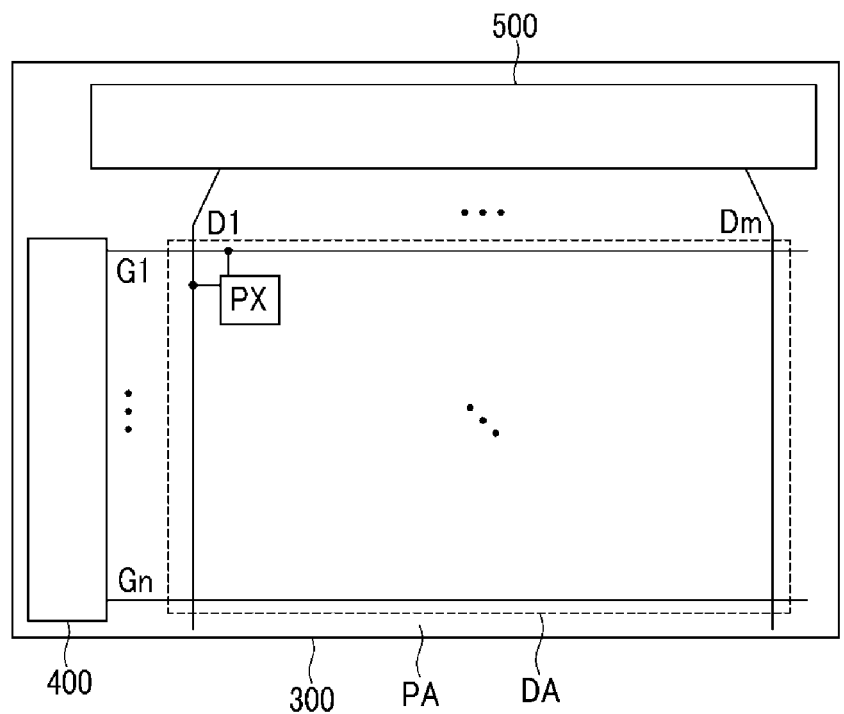
FIG. 1 is a block diagram of a display device according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. It will be understood that for the purposes of this disclosure, "at least one of X, Y, and Z" can be construed as X only, Y only, Z only, or any combination of two or more items X, Y, and Z (e.g., XYZ, XZ, XYY, YZ, ZZ). Throughout the drawings and the detailed description, unless otherwise described, the same drawing reference numerals are understood to refer to the same elements, features, and structures. The relative size and depiction of these elements may be exaggerated for clarity.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present.

A display device according to an exemplary embodiment of the present invention will be described with reference to FIG. 1.

FIG. 1 is a block diagram of a display device according to an exemplary embodiment of the present invention.

As shown in FIG. 1, a display device includes a display panel 300, a scan driver 400, and a data driver 500.

The display panel 300 includes a plurality of gate lines G1-Gn, a plurality of data lines D1-Dm, and a plurality of pixels PX connected to the plurality of gate lines G1-Gn and the plurality of data lines D1-Dm. The display panel 300 includes a display area DA where the plurality of pixel PX is arranged, and a peripheral area PA surrounding the display area DA. The gate lines G1-Gn transmit a gate signal and the data lines D1-Dm transmit a data voltage. Each pixel PX may include a switching element and a pixel electrode connected to one of the gate lines G1-Gn and one of the data lines D1-Dm. The switching element may be a three terminal element, such as a thin film transistor integrated in the display panel 300.

The data driver 500 is connected to the data lines D1-Dm, which may be used to transmit the data voltage. The data driver 500 may be directly mounted in the peripheral area PA of the display panel 300, may be integrated directly in the peripheral area PA in the same manufacturing process as the switching element that includes the pixel PX, or may be disposed on a flexible printed circuit film attached to the display panel 300 differently, from FIG. 1.

The scan driver 400 may be integrated in the peripheral area PA of the display panel 300 and sequentially transmit the gate signal to the plurality of gate lines G1-Gn. The gate signal may include a gate-on voltage Von signal and a gate-off voltage Voff signal.

Other elements in addition to a display panel 300, a scan driver 400, a data driver 500 may be included in the display device. More specifically, the display device may further include a plurality of electrical elements such as a plurality of transistors, a plurality of capacitors, and a plurality of diodes, and each electrical element or wiring connected thereto may include at least one conductive layer. If at least two electrical elements are connected to each other, or one electrical element and an external signal input/output terminal are connected to each other, the conductive layers of different layers may be electrically connected to each other. The conductive layers of the different layers are electrically connected to each other through a connection.

The connection according to an exemplary embodiment of the present invention will be described with reference to FIG. 2, FIG. 3, FIG. 4, and FIG. 5.

Figure 2:
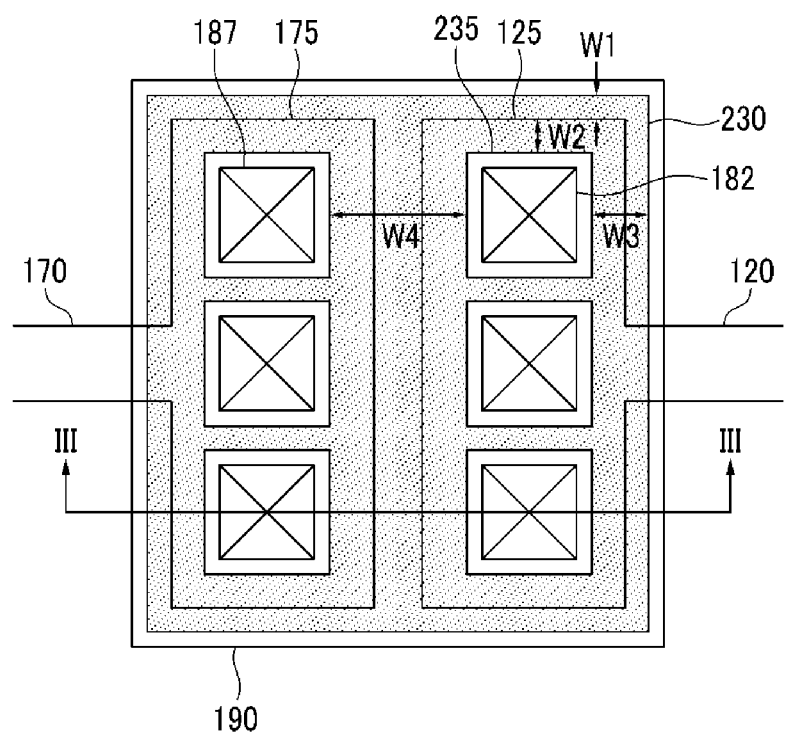
FIG. 2 is a top plan view of one connection of a display device according to an exemplary embodiment of the present invention.
Figure 3:
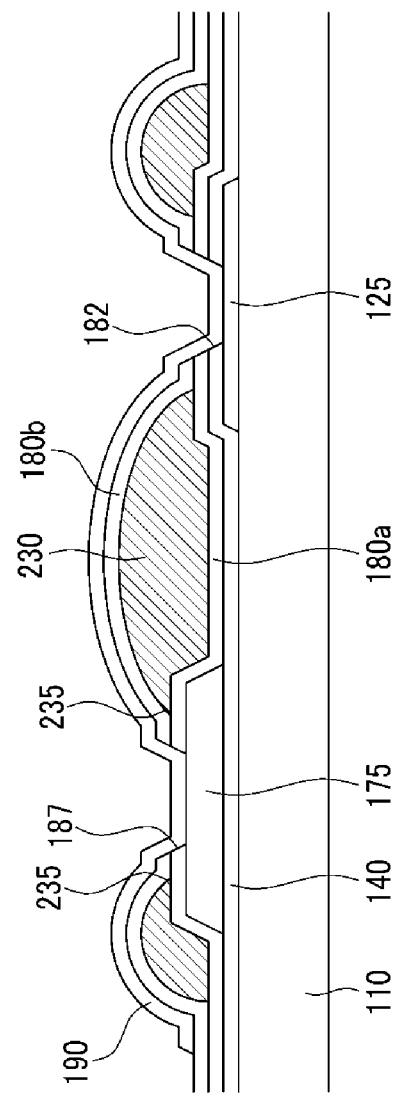
FIG. 3, FIG. 4, and FIG. 5 are cross-sectional views of the connection of FIG. 2 taken along the line III-III.
Figure 4:
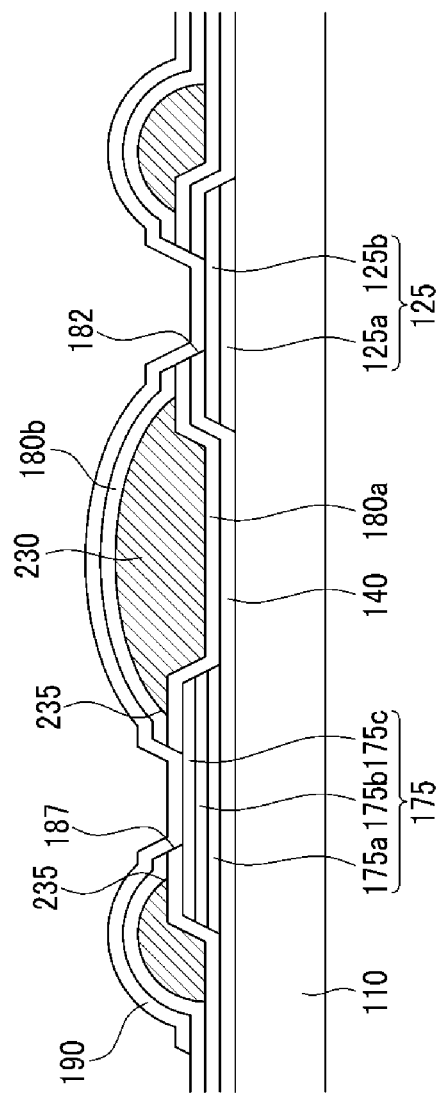
Figure 5:
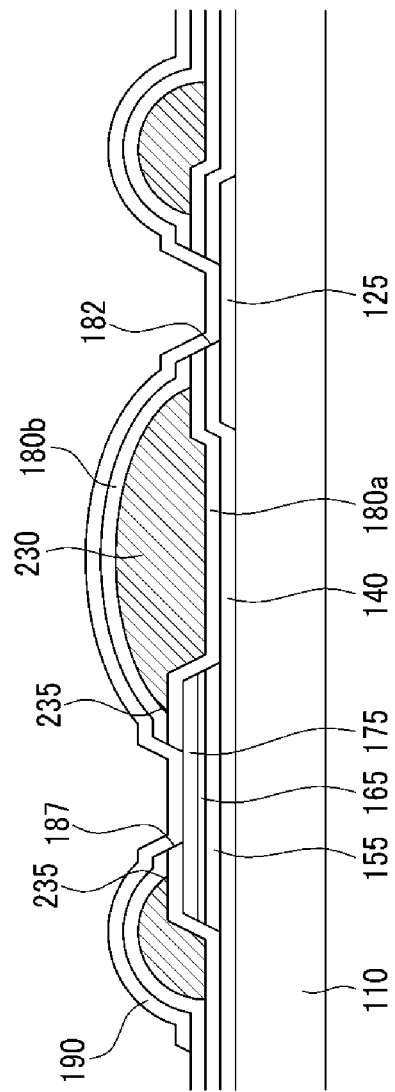

FIG. 2 is a top plan view of one connection of a display device according to an exemplary embodiment of the present invention. FIG. 3, FIG. 4, and FIG. 5 are cross-sectional views of the connection of FIG. 2 taken along the line III-III.

A gate conductive layer 120 is disposed on an insulation substrate 110. The gate conductive layer 120 may include a gate terminal 125 to connect with another layer. The gate terminal 125 may have a wider width or area than another portion of the gate conductive layer 120. The shape of the gate terminal 125 is not limited to a quadrangle as illustrated in FIG. 2 and may be in various shapes.

The gate conductive layer 120 may be made of, without limitation, an aluminum-based metal, such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), and titanium (Ti). As shown in FIG. 4, the gate conductive layer 120 may have a multilayer structure including a conductive layer 125a and a conductive layer 125b. Among them, the lower conductive layer 125a may be made of a metal having lower resistivity to reduce a signal delay or a voltage drop. For example, the lower conductive layer 125a may be made of an aluminum-based metal, a silver-based metal, or a copper-based metal. The upper conductive layer 125b may be made of a material having an excellent contact characteristic, such as the molybdenum-based metal, chromium, tantalum, or titanium along with another material, such as a metal oxide of ITO (indium tin oxide) or IZO (indium zinc oxide). As examples of the lower conductive layer 125a and the upper conductive layer 125b, there are a chromium lower conductive layer and an aluminum (alloy) upper conductive layer, and an aluminum (alloy) lower conductive layer and a molybdenum (alloy) upper conductive layer. However, the gate conductive layer 120 may be made of various metals or conductors and are not limited to the examples described herein.

A gate insulating layer 140 made of an insulating material, such as silicon nitride (SiNx) or silicon oxide (SiOx) is formed on the gate conductive layer 120.

Referring to FIG. 5, a semiconductor 155 may be formed on the gate insulating layer 140. If forming the semiconductor 155 on the gate insulating layer 140, an ohmic contact 165 made of a material, such as silicide or n+hydrogenated amorphous silicon doped with an n-type impurity at a high concentration may be disposed on the semiconductor 155. However, as shown in FIG. 3 and FIG. 4, the semiconductor 155 and the ohmic contact 165 on the gate insulating layer 140 may be omitted.

A data conductive layer 170 is disposed on the gate insulating layer 140 or the ohmic contact 165. The data conductive layer 170 may include a data terminal 175 to connect with other layers. The data terminal 175 may have a wider width and area than another portion of the data conductive layer 170. The shape of the data terminal 175 is not limited to the quadrangle shown in FIG. 2 and may be various.

The data conductive layer 170 may be made of a metal, such as molybdenum, chromium, tantalum, and titanium, or alloys thereof. The data conductive layer 170 may have the multilayer structure including at least two conductive layers. As an example of the multilayer structure, there are a dual layer including chromium or a molybdenum (alloy) lower conductive layer, and an aluminum (alloy) upper conductive layer. A triple layer including a molybdenum (alloy) lower conductive layer, an aluminum (alloy) middle conductive layer, and a molybdenum (alloy) upper conductive layer. FIG. 4 illustrates an example of a data conductive layer 170, which may have a triple layer composition including a lower conductive layer 175a, a middle conductive layer 175b, and an upper conductive layer 175c. However, the data conductive layer 170 may be made of various metals or conductors and are not limited to those described herein.

As shown in FIG. 5, if positioning the semiconductor 155 and the ohmic contact 165 under the data conductive layer 170, the ohmic contact 165 is disposed between the overlaying data conductive layer 170 and the underlying semiconductor 155 to reduce the contact resistance therebetween.

The gate terminal 125 of the gate conductive layer 120 and the data terminal 175 of the data conductive layer 170 may face each other in the connection. Also, in a plane view, an interval between the gate terminal 125 and the data terminal 175 may be 0 or more. However, the gate terminal 125 and the data terminal 175 may be partially overlapped.

A lower passivation layer 180a, which may be made of an inorganic insulator such as silicon nitride or silicon oxide, is disposed on the data conductive layer 170.

A profile relieving member 230 is disposed on the lower passivation layer 180a. The profile relieving member 230 may cover and overlap at least a portion of the edge of the data terminal 175 of the underlying data conductive layer 170 or the edge of the gate terminal 125 of the underlying gate conductive layer 120. Accordingly, the profile relieving member 230 may smooth a step portion formed by the edge of the data terminal 175 of the underlying data conductive layer 170 or the gate terminal 125 of the underlying gate conductive layer 120.

Distances W1 and W2 between the outer or inner edge of the profile relieving member 230 and the edge of the gate terminal 125 or the data terminal 175 may be 10 μm or more to provide a profile relieving effect. To reduce the likelihood of the profile relieving member 230 being lifted or displaced, the width of the profile relieving member 230, that is, a distances W3 and W4 between facing edges of the profile relieving member 230, may be 50 μm or more.

The profile relieving member 230 may include a material forming a color filter or a light blocking member. Further, the profile relieving member 230 may be formed together if forming the color filter or the light blocking member in the display area DA of the display panel 300, or independently thereof.

The light blocking member may prevent or reduce a likelihood of light leakage between the pixels PX in the display area DA and may have a plurality of openings. In an example, the light blocking member may include a black pigment.

The color filter may be formed in the pixel PX of the display panel 300, such that each pixel PX may display a unique color. One color filter may represent one primary color, and the primary color may include three primary colors, such as red, green, and blue. That is, the color filter may include a red color filter, a green color filter, and a blue color filter. The color filter of each color may be aggregated in a region enclosed by the light blocking member or may extend according to a row of the pixel PX. The color filters displaying the different colors may be alternately arranged for each pixel.

The color filter or the light blocking member may be made of an organic material and may have photosensitivity. The color filter and the light blocking member may further include a corresponding pigment or another pigment to display the unique color.

If the profile relieving member 230 includes the color filter, the distances W3 and W4 of FIG. 2 between the facing edges of the profile relieving member 230 may be 50 μm or more, such that a likelihood of the lifting of the material that may be used to form the color filter may be reduced. Particularly, if the profile relieving member 230 is formed of the material used to form the blue color filter, adherence of the profile relieving member 230 may be further increased.

Referring to FIG. 2, the profile relieving member 230 may cover most edges of the data terminal 175 and the gate terminal 125 in the connection. The profile relieving member 230 may have at least one opening 235 disposed on the data terminal 175 and the gate terminal 125. At this time, the distances W3 and W1+W2, which may be a distance between the edge of the opening 235 and the outer edge of the profile relieving member 230, or the distance W4 between the edges of neighboring openings 235 may be 50 μm or more. By providing such width, between the openings 235 and/or edges of the relieving member 230, adherence between the profile relieving member 230 and the lower passivation layer 180a may be provided. Various shapes of the profile relieving member 230 will be described later.

An upper passivation layer 180b may be formed on the profile relieving member 230 and the lower passivation layer 180a. The upper passivation layer 180b may be made of an inorganic insulating material, such as silicon nitride or silicon oxide. The upper passivation layer 180b may reduce the likelihood of the profile relieving member 230 from being lifted or becoming unsecured. Further, the upper passivation layer 180b may also reduce the likelihood of an organic material, such as a solvent, flowing in from the profile relieving member 230 from flowing outside. The upper passivation layer 180b may reduce the likelihood of a chemical solution, such as an etchant, from flowing into the profile relieving member 230 from the outside. The upper passivation layer 180b may be omitted.

The lower passivation layer 180a and the upper passivation layer 180b may have at least one contact hole 187 exposing the data terminal 175 of the data conductive layer 170. The upper passivation layer 180b, the lower passivation layer 180a, and the gate insulating layer 140 may have at least one contact hole 182 exposing the gate terminal 125 of the gate conductive layer 120.

A contact assistant 190 may be formed on the upper passivation layer 180b.

The contact assistant 190 may electrically connect the gate terminal 125 and the data terminal 175 through the contact holes 187 and 182. The contact assistant 190 may be made of a conductive material. An example of the conductive material may include a transparent conductive material, such as ITO or IZO, or a reflective metal, such as aluminum, silver, chromium, or alloys thereof. Further, as shown in FIG. 2, the outer edge of the profile relieving member 230 may be disposed inside the outer edge of the contact assistants 190, but is not limited as such.

In the connection, the profile relieving member 230 covering at least a portion of the edge of the data terminal 175 of the data conductive layer 170 or the gate terminal 125 of the gate conductive layer 120 may be formed. The profile relieving member 230 may be formed, such that a step portion formed on the data conductive layer 170 or the gate conductive layer 120 may not be imputed to the overlying contact assistant 190. In an example, the step portions may be formed by the edges of the data terminal 175, edges of the gate terminal 125 or the like. The profile relieving member 230 may smooth the step of the underlying layer, such that the contact assistant 190 may have a profile of a curve and not the same profile as the step portion of the data conductive layer 170 or the gate conductive layer 120. Accordingly, the likelihood of disconnection of the contact assistant 190 may be reduced. Although the contact assistant 190 is described as having a profile of a curve, it is not limited thereto and may include profiles of different shapes.

Further, as shown in FIG. 4, if the data conductive layer 170 has a multilayer composition or has the semiconductor 155 under the data conductive layer 170, the step portion of the data conductive layer 170 may be increased. However, the step portion may be smoothed by the overlying profile relieving member 230, such that the chance of disconnection of the contact assistant 190 may be reduced.

The profile of the contact assistant 190 may be smoothed by the profile relieving member 230, such that the likelihood of disconnection of the contact assistant 190 generated near the edge of the data terminal 175 or the gate terminal 125 may be reduced even if heat may be generated by resistance of the contact assistants 190, a large flowing current, or other reasons.

Although a skew or an undercut may be generated at the edge of the data terminal 175 or the edge of the gate terminal 125 during the manufacturing process, the contact assistant 190 may not be disconnected near the edge of the data terminal 175 or the gate terminal 125 since the profile relieving member 230 may be formed over the edges of the data terminal 175 and the gate terminal 125. Accordingly, the electrical connection of two conductive layers, that is, the data conductive layer 170 and the gate conductive layer 120, by the contact assistant 190 may be more stable and a likelihood of incurring a defect in the connection may be reduced.

Next, the shape of the profile relieving member 230 according to various exemplary embodiments of the present invention will be described with reference to FIG. 3 to FIG. 16. The same constituent elements as in the previous exemplary embodiment are indicated by the same reference numerals, and the same description is omitted.

FIG. 6, FIG. 7, FIG. 8, FIG. 9, FIG. 10, FIG. 11, FIG. 12, FIG. 13, FIG. 14, FIG. 15, FIG. 16, and FIG. 17 are respectively a top plan view of one connection of a display device according to an exemplary embodiment of the present invention.

Figure 6:
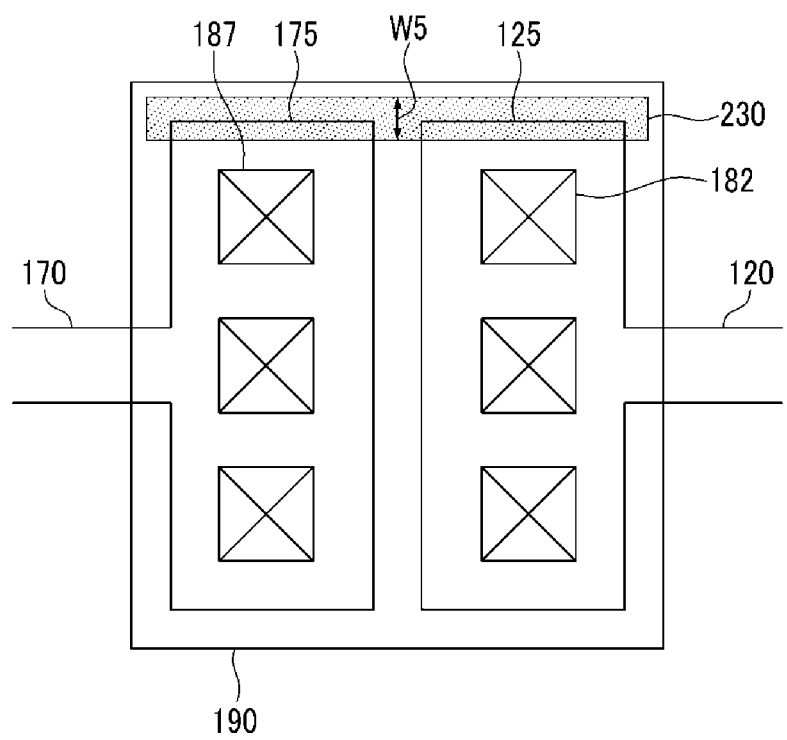
FIG. 6, FIG. 7, FIG. 8, FIG. 9, FIG. 10, FIG. 11, FIG. 12, FIG. 13, FIG. 14, FIG. 15, FIG. 16, and FIG. 17 are top plan views of one connection of a display device according to an exemplary embodiment of the present invention.

Referring to FIG. 6, differently from the above-described FIG. 2, the profile relieving member 230 may cover one edge of the data terminal 175 of the data conductive layer 170 and the gate terminal 125 of the gate conductive layer 120. The edge covered by the profile relieving member 230 may be at least one edge of the four edges of the data terminal 175 or the gate terminal 125. At this time, the width of the profile relieving member 230, that is, the distance W5 between facing edges, may be 50 μm or more.

Figure 7:
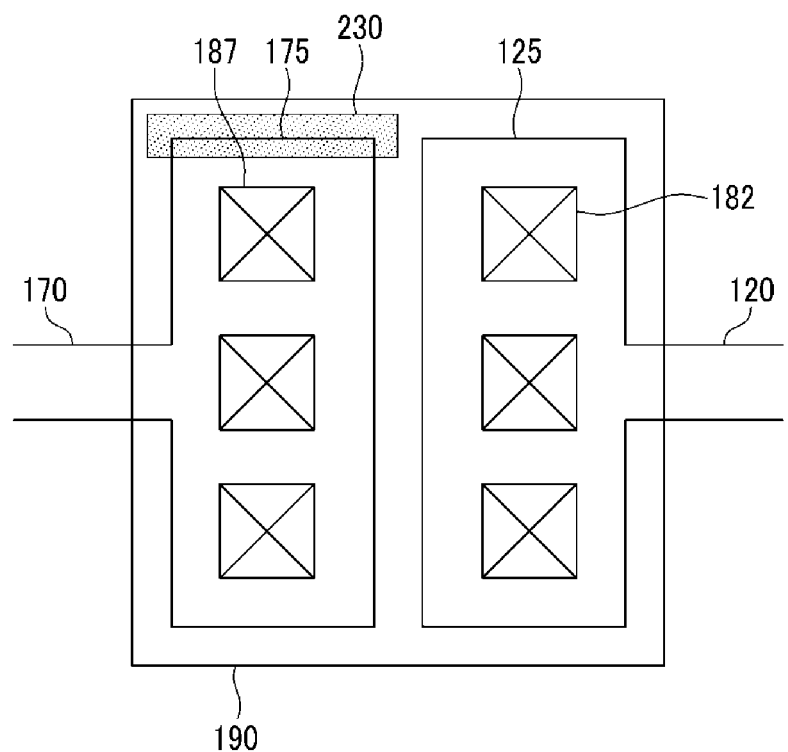

Referring to FIG. 7, the exemplary embodiment illustrated herein is mostly the same as the exemplary embodiment shown in FIG. 6, however, the profile relieving member 230 may cover only one edge of either the data terminal 175 or the gate terminal 125. If the lower passivation layer 180a is thinner than the gate insulating layer 140, the data conductive layer 170 may be thicker than the gate conductive layer 120, or the semiconductor disposed under the data conductive layer 170. Further, if the lower passivation layer 180a is thinner than the gate insulating layer 140, the profile relieving member 230 may not cover the edge of the gate terminal 125 and may cover at least a portion of the edge of the data terminal 175.

Figure 8:
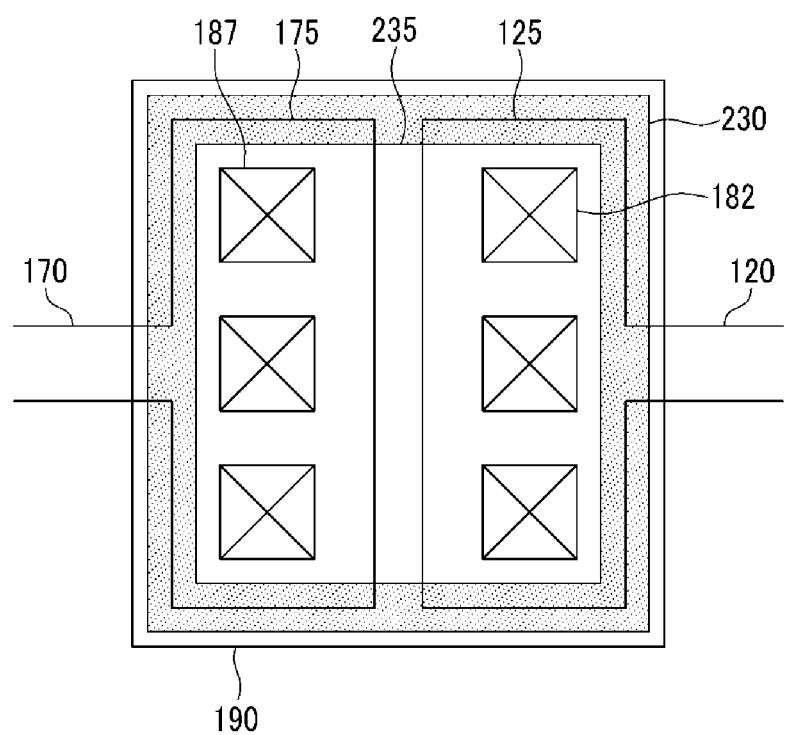

Referring to FIG. 8, the exemplary embodiment illustrated herein is mostly the same as the exemplary embodiment shown in FIG. 2, however, at least two contact holes 187 and 182 may be disposed inside the opening 235 of the profile relieving member 230, which may expose the contact holes 187 and 182. FIG. 8 shows an example of the profile relieving member 230 having one opening 235 in one connection. As above-described, the distance between the edge of the opening 235 and the outer edge of the profile relieving member 230, that is, the width of the profile relieving member 230, may be 50 μm or more.

Figure 9:
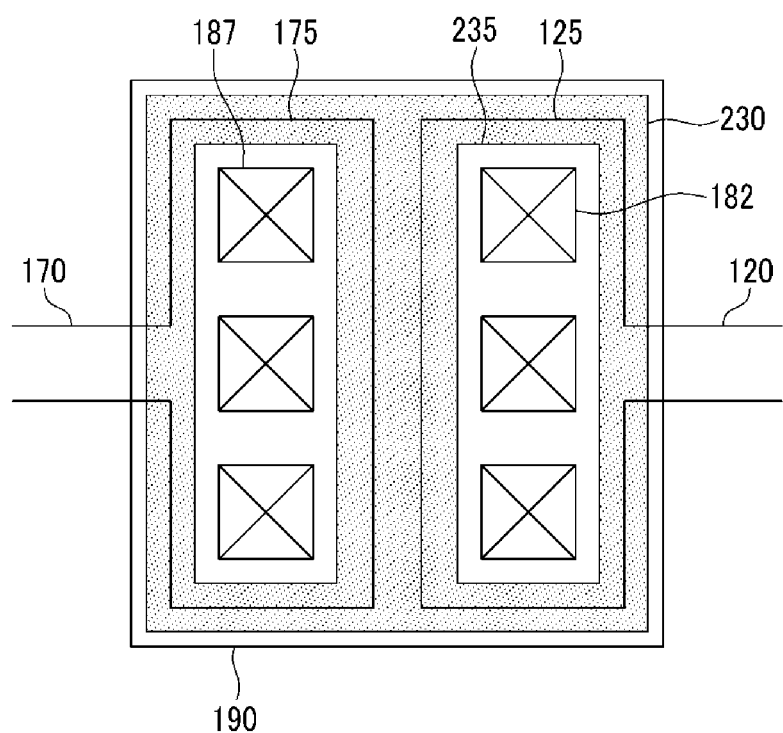

Referring to FIG. 9, the exemplary embodiment illustrated herein is mostly the same as the exemplary embodiment shown in FIG. 8, however, the profile relieving member 230 may include one opening 235 on each of the data terminal 175 and the gate terminal 125. That is, at least one contact hole 187 exposing the data terminal 175 may be disposed inside the edge of the opening 235, which may be disposed on the data terminal 175, and at least one contact hole 182 exposing the gate terminal 125 may be disposed inside the edge of the opening 235, which may be disposed on the gate terminal 125.

Figure 10:
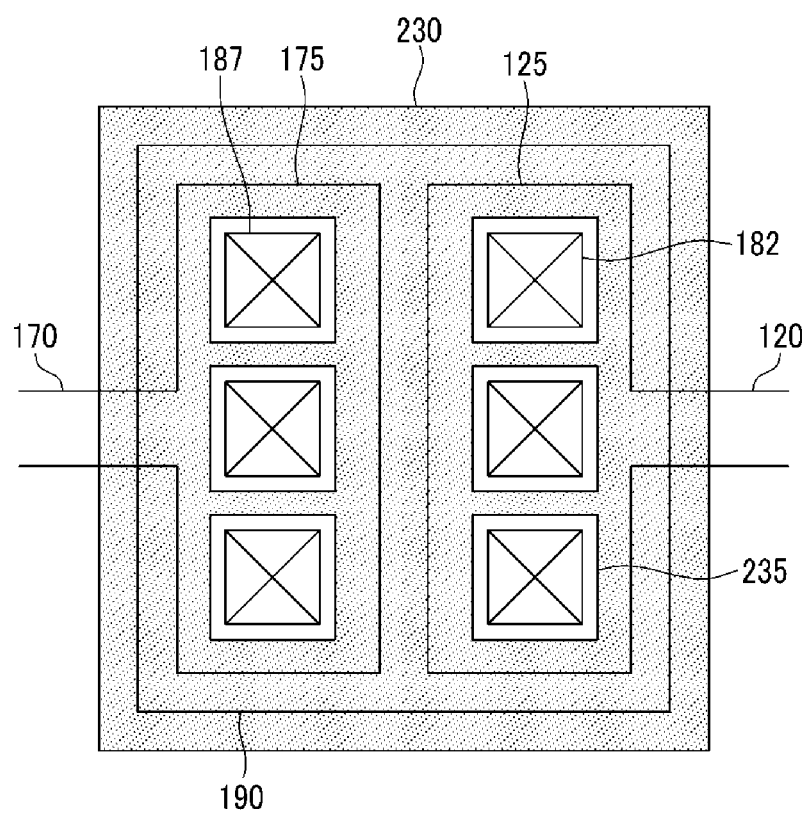

Referring to FIG. 10, the exemplary embodiment illustrated herein is mostly the same as the exemplary embodiment shown in FIG. 2, however, the outer edge of the profile relieving member 230 may be disposed outside the outer edge of the contact assistants 190.

Figure 11:
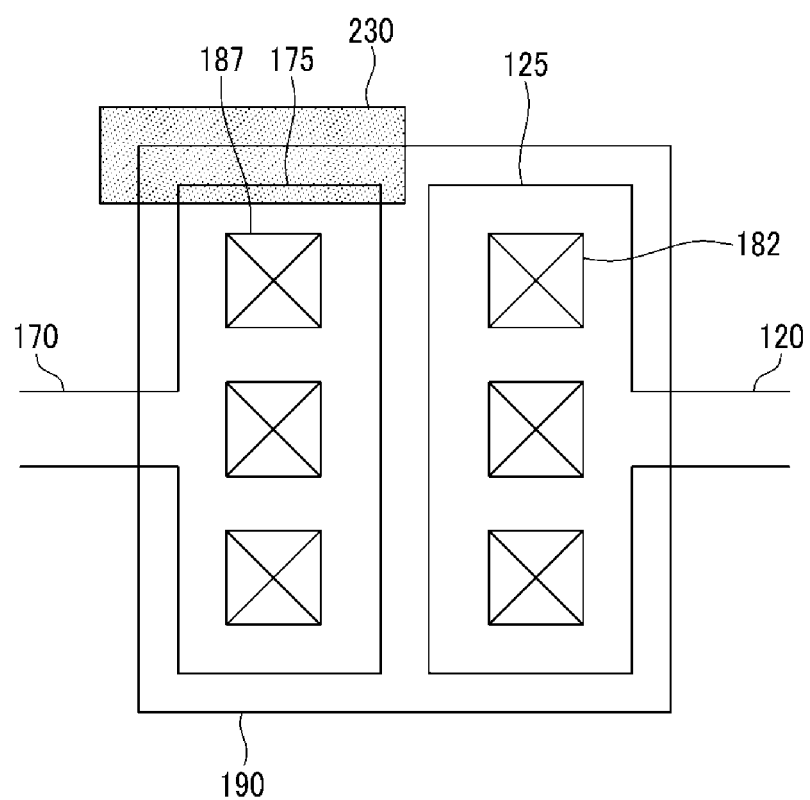

Referring to FIG. 11, the exemplary embodiment illustrated herein is mostly the same as the exemplary embodiment shown in FIG. 7, however, the profile relieving member 230 may also cover the edge of the contact assistant 190.

Figure 12:
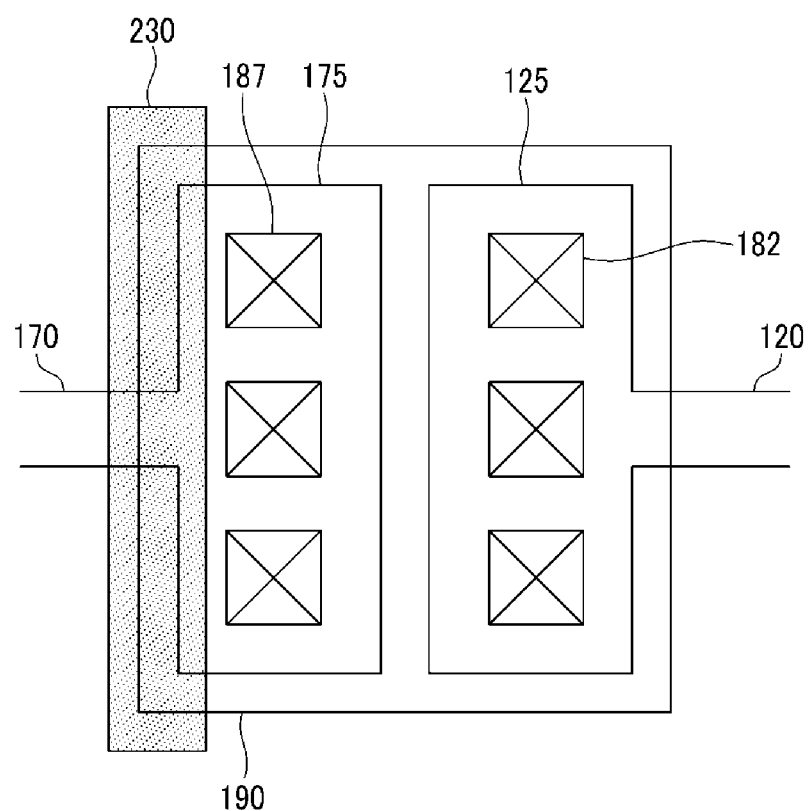

Referring to FIG. 12, the exemplary embodiment illustrated herein is mostly the same as the exemplary embodiment shown in FIG. 6, however, the profile relieving member 230 may also cover the edge of the corresponding contact assistants 190. The profile relieving member 230 may cover the edge that does not face the gate terminal 125 among the edges of the data terminal 175, for example, the edge of the data terminal 175 facing the gate terminal 125 via the contact hole 187.

Figure 13:
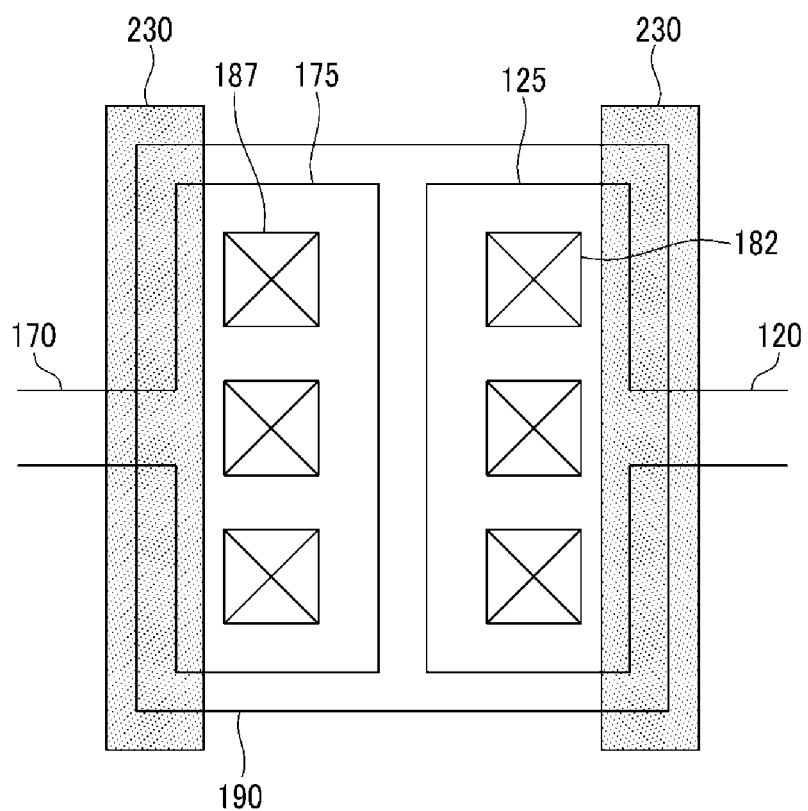

Referring to FIG. 13, the exemplary embodiment illustrated herein is mostly the same as the exemplary embodiment shown in FIG. 12, however, the profile relieving member 230 may cover the portion of the edge of the gate terminal 125. The profile relieving member 230 may cover the edge that does not face the data terminal 175 among the edges of the gate terminal 125, for example, the edge of the gate terminal 125 facing the data terminal 175 via the contact hole 187.

Figure 14:
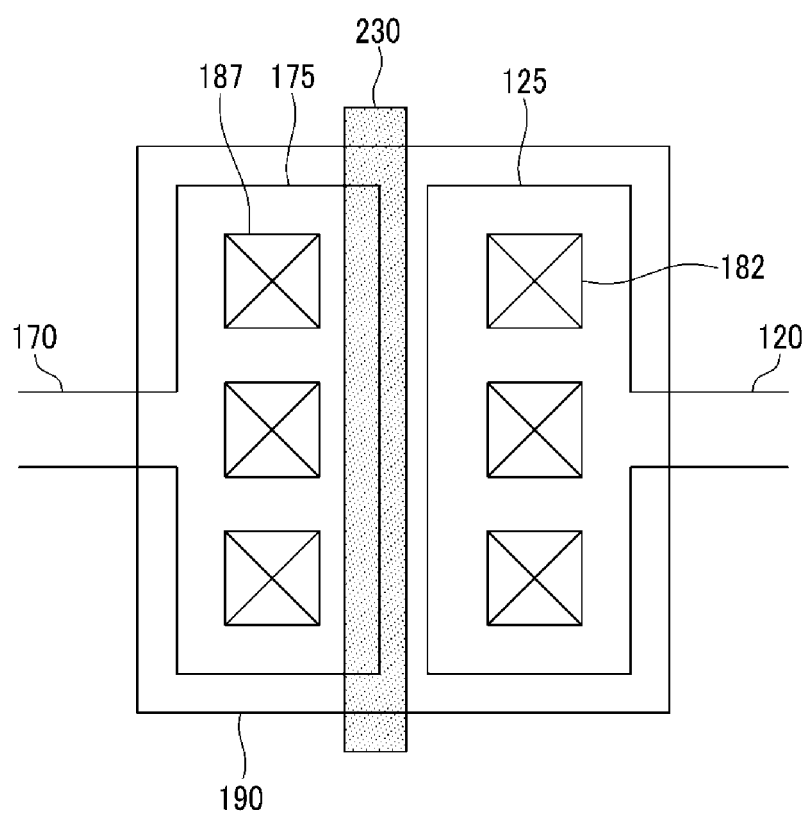
Figure 15:
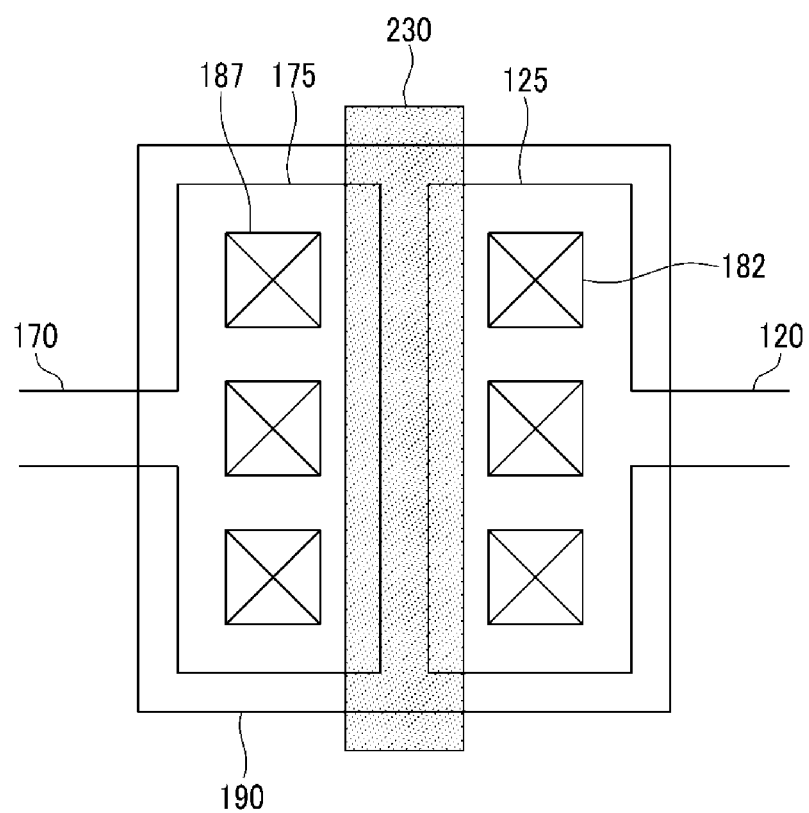

Referring to FIG. 14 and FIG. 15, the profile relieving member 230 may cover the edge facing the gate terminal 125 among the edges of the data terminal 175. As shown in FIG. 15, the profile relieving member 230 may cover both the edge of the data terminal 175 and the edge of the gate terminal 125 that are facing each other. As above-described, if the profile relieving member 230 covers at least one of the edge of the data terminal 175 and the edge of the gate terminal 125 facing each other, even if the contact assistants 190 is disconnected, the likelihood of a defect related to the electrical connection of the two conductive layers 170 and 120 may be reduced.

Figure 16:
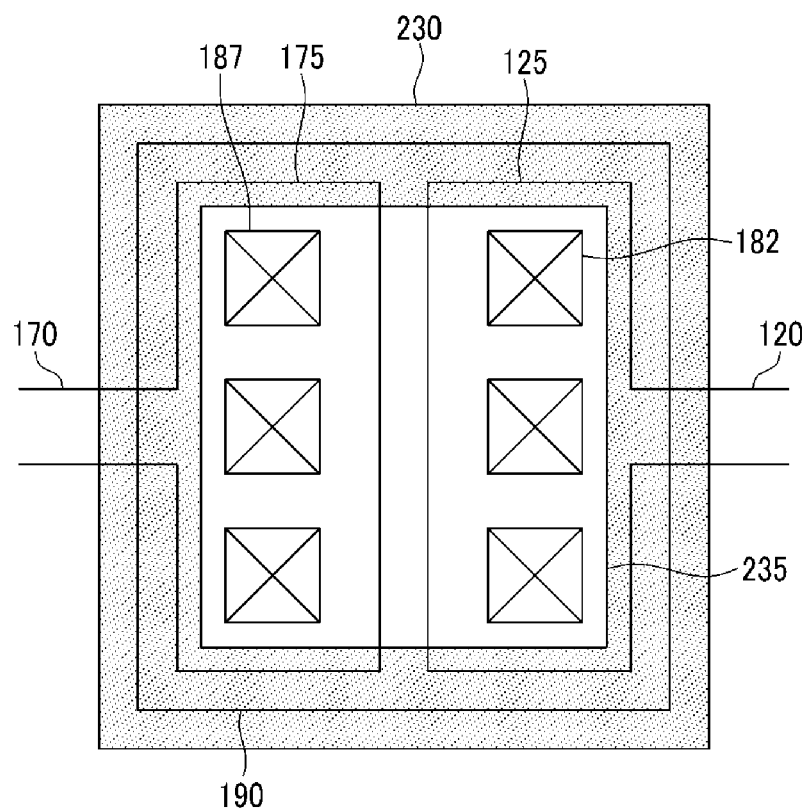
Figure 17:
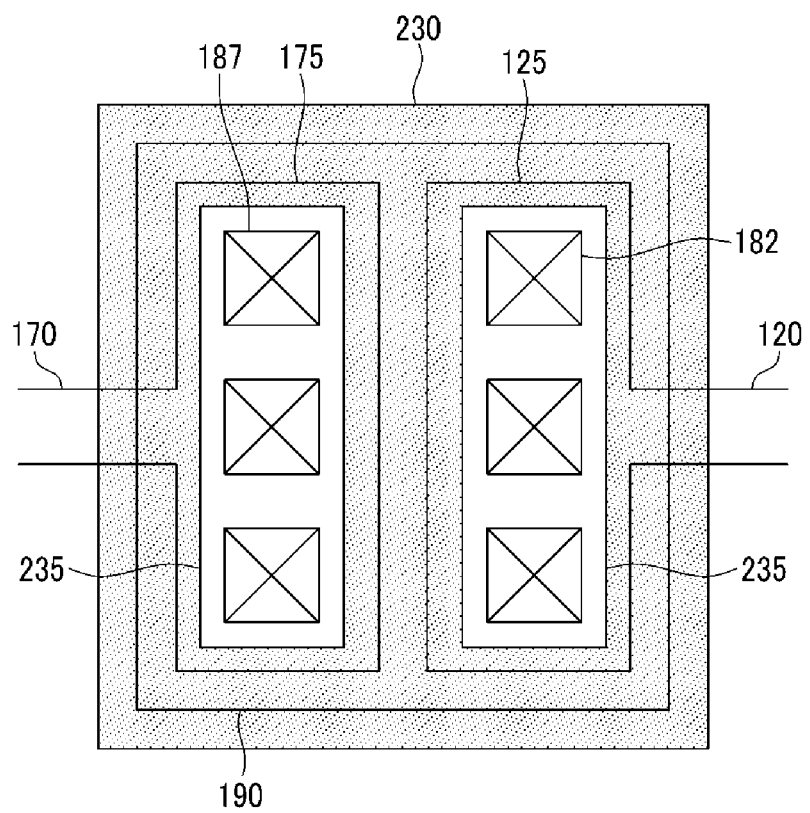

Referring to FIG. 16 and FIG. 17, the exemplary embodiments illustrated herein are mostly the same as the exemplary embodiments shown in FIG. 8 and FIG. 9, respectively. However, FIG. 16 and FIG. 17 illustrates the profile relieving member 230, which extends outwards such that the corresponding edges of the contact assistant 190 may be covered together.

The profile relieving member 230 may be illustrated as having a rectangular shape, however, one or more corners thereof may be chamfered and/or rounded. The profile relieving member 230 may have various shapes as well as the above-described exemplary embodiments.

Next, referring to FIG. 18 and FIG. 19, a display panel 300 including the color filter or the light blocking member made of the same material as the above-described profile relieving member 230 will be described.

Figure 18:
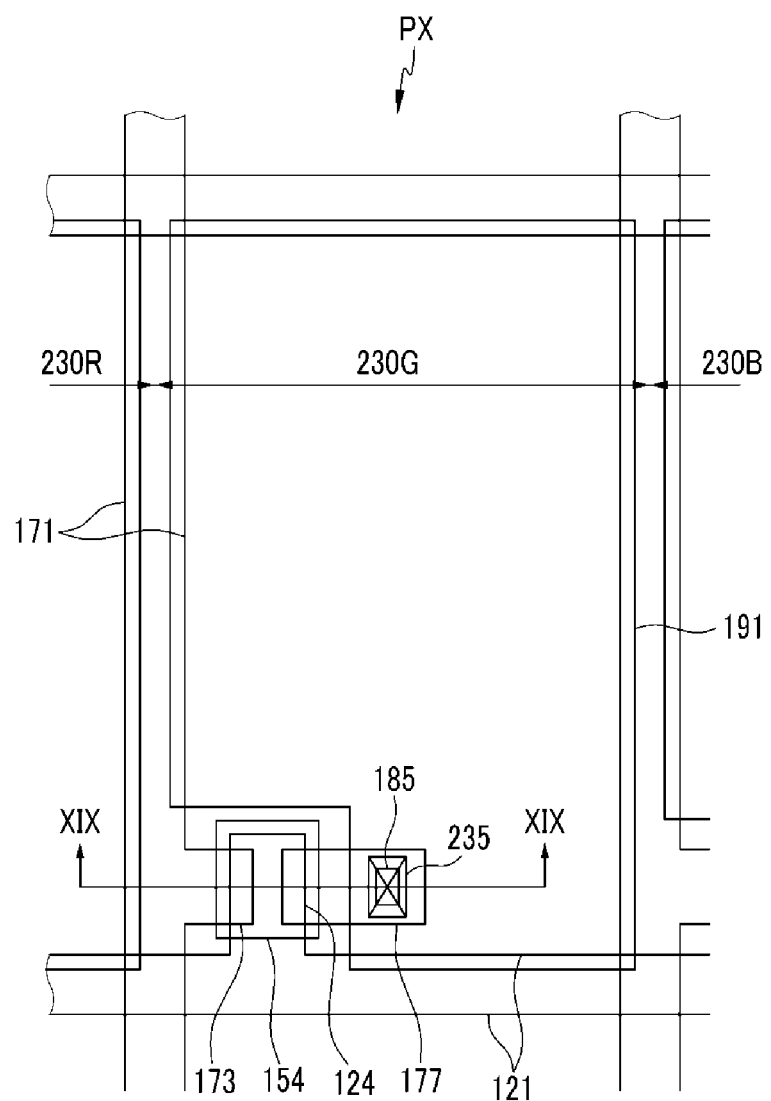
FIG. 18 is a top plan view of a display device according to an exemplary embodiment of the present invention.
Figure 19:
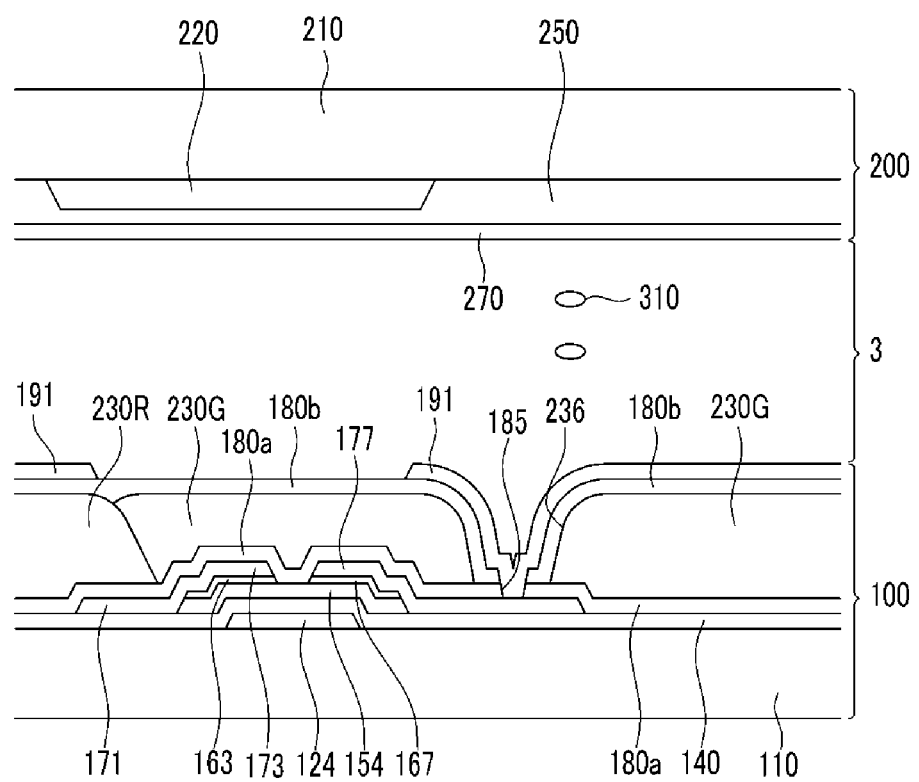
FIG. 19 is a cross-sectional view of the display device shown in FIG. 18 taken along the line XIX-XIX.

FIG. 18 is a top plan view of a display device according to an exemplary embodiment of the present invention, and FIG. 19 is a cross-sectional view of the display device shown in FIG. 18 taken along the line XIX-XIX.

The color filter or the light blocking member may be formed in the display area DA of the above-described display panel 300.

Referring to FIG. 18 and FIG. 19, the display device according to an exemplary embodiment of the present invention may be a liquid crystal display, which includes a lower panel 100 and an upper panel 200 facing each other with a liquid crystal layer 3 interposed therebetween.

Firstly, referring to the lower panel 100, a plurality of gate lines 121 including a plurality of gate electrodes 124 are formed on the insulation substrate 110. A gate insulating layer 140 is formed on the gate lines 121 and a semiconductor 154 is formed on the gate insulating layer 140. The semiconductor 154 may be formed with the same process as the semiconductor 155 shown in FIG. 5. A plurality of pairs of ohmic contacts 163 and 167 are disposed on the semiconductor 154, and a plurality of data lines 171 and a plurality of drain electrodes 177 are formed thereof. Each data line 171 may include a source electrode 173 facing the drain electrode 177.

A lower passivation layer 180a is disposed on the data line 171 and the drain electrode 177, and color filters 230R, 230G, and 230B are disposed thereon. The color filters 230R, 230G, and 230B may include a red color filter 230R, a green color filter 230G, and a blue color filter 230B extending in a direction parallel to the data line 171 according to the rows of the pixels PX defined by the data lines 171. If forming the color filters 230R, 230G, and 230B, the profile relieving member 230 may be formed with the same process and the same material as the color filters 230R, 230G, and 230B in the several connections of the driver (e.g., the scan driver 400) integrated in the peripheral area PA of the display panel 300.

An upper passivation layer 180b is disposed on the color filters 230R, 230G, and 230B. The lower passivation layer 180a and the upper passivation layer 180b have a contact hole 185 exposing the drain electrode 177, and the color filters 230R, 230G, and 230B have an opening 236 exposing the drain electrode 177. A pixel electrode 191 is disposed on the upper passivation layer 180b. The pixel electrode 191 is connected to the drain electrode 177 through the contact hole 185 thereby receiving the data voltage.

Next, referring to the upper panel 200, a plurality of light blocking members 220 referred to as a black matrix separated by a reference interval are formed on an insulation substrate 210. However, differently from FIG. 19, the light blocking member 220 may be formed in the lower panel 100, and in this case, the profile relieving member 230 may be formed with the same material as the light blocking member 220.

A planarization layer 250 and a common electrode 270 may be formed on the light blocking member 220.

The liquid crystal layer 3 includes a plurality of liquid crystal molecules 310.

A scan driver 400 to be integrated in the peripheral area PA of the display panel 300 as one example of a constituent element forming the above-described profile relieving member 230 will be described with reference to FIG. 20 and FIG. 21.

Figure 20:
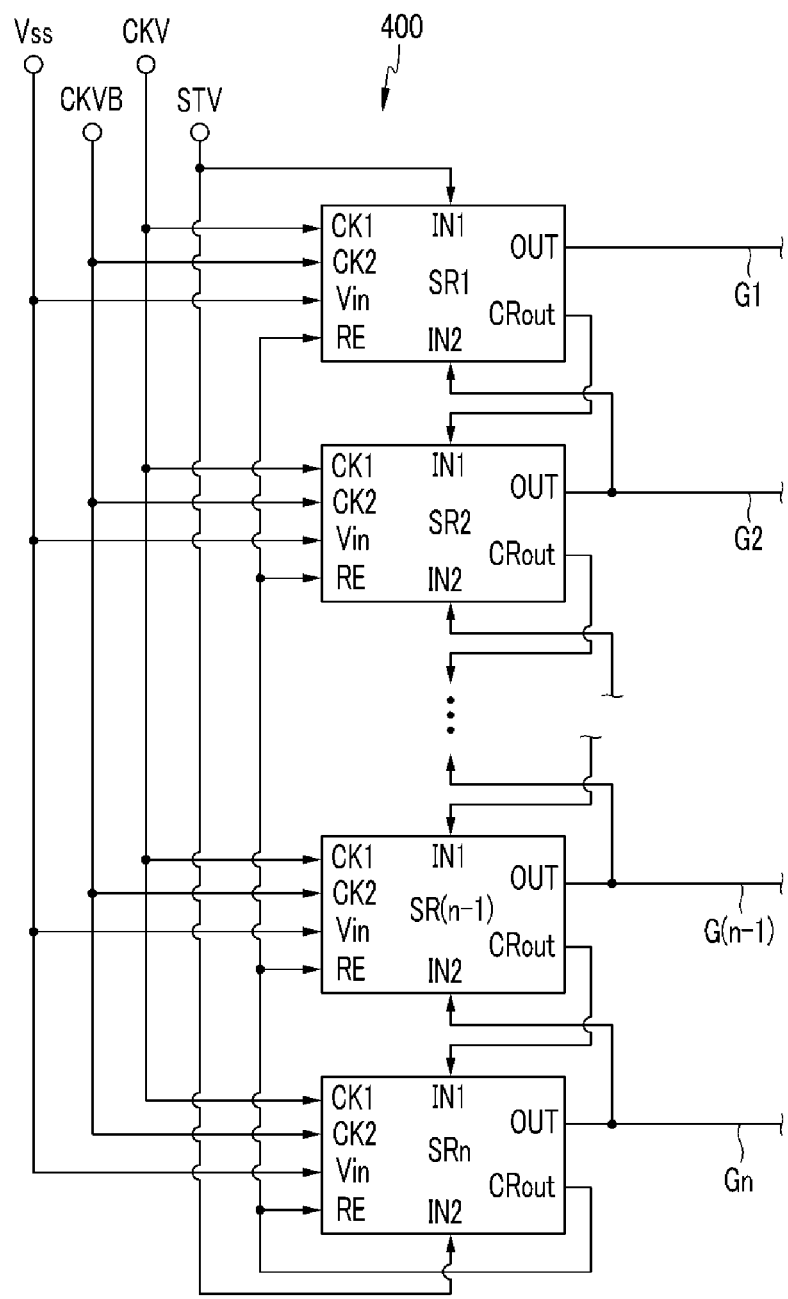
FIG. 20 is a block diagram of a scan driver of a display device according to an exemplary embodiment of the present invention.
Figure 21:
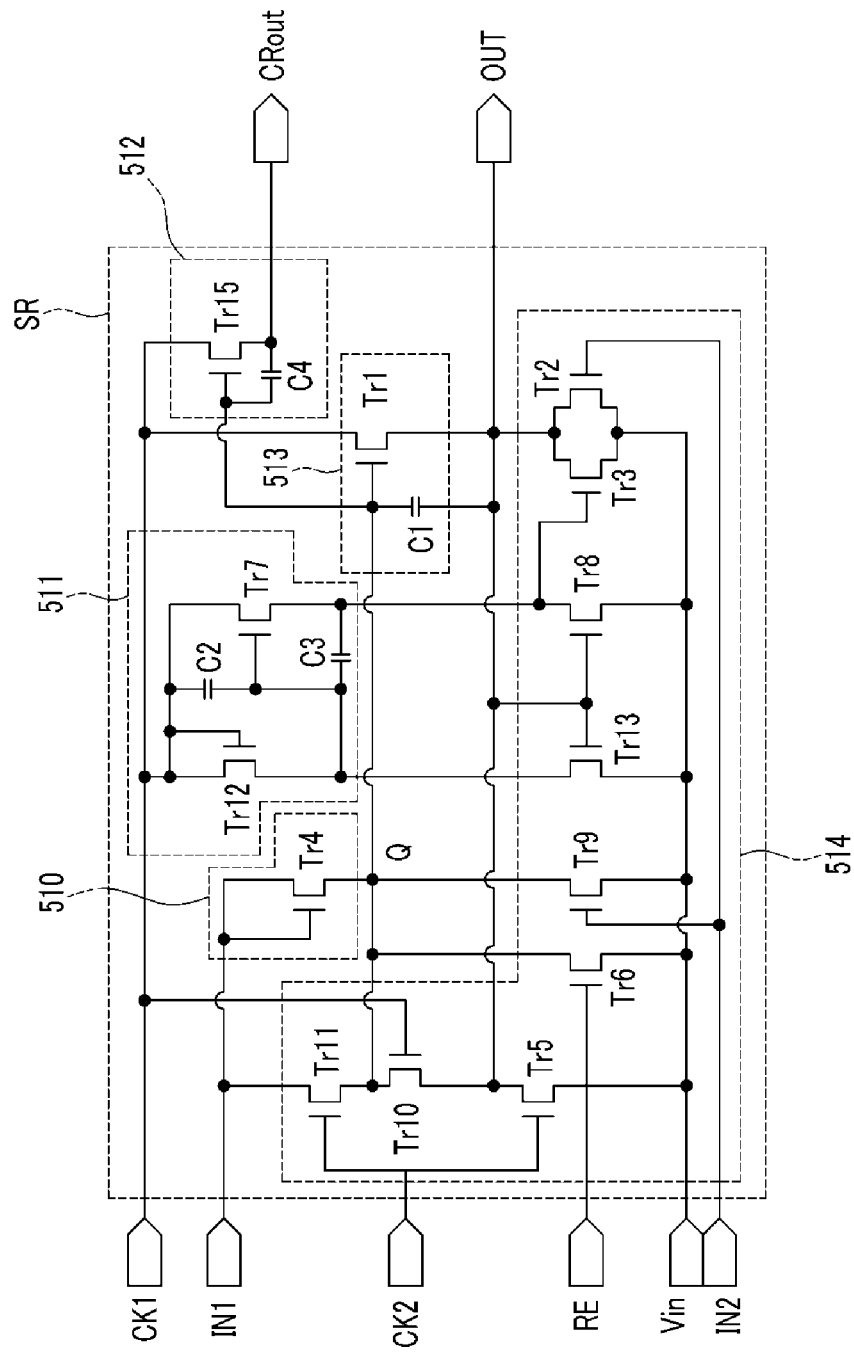
FIG. 21 is a circuit diagram of one stage of a scan driver according to an exemplary embodiment of the present invention.

FIG. 20 is a block diagram of a scan driver of a display device according to an exemplary embodiment of the present invention, and FIG. 21 is a circuit diagram of one stage of a scan driver according to an exemplary embodiment of the present invention.

The scan driver 400 according to an exemplary embodiment of the present invention includes a plurality of stages SR1-SRn subordinately connected to each other. Each of the stages SR1-SRn may include two input terminals IN1 and IN2, two clock input terminals CK1 and CK2, a voltage input terminal Vin receiving a low voltage Vss corresponding to a gate-off voltage, a reset terminal RE, an output terminal OUT, and a transmission signal output terminal CRout, however, it is not limited thereto and may vary. Hereafter, a case that the scan driver 400 includes the constitution shown in FIG. 20 will be described.

The first input terminal IN1 is connected to the transmission signal output terminal CRout of the previous stage to receive a transmission signal of the previous stage, and the first input terminal IN1 of the first stage SR1 receives a scan start signal STV.

The second input terminal IN2 is connected to the output terminal OUT of the next stage to receive the gate voltage of the next state. The final stage SRn may be a dummy stage, and the second input terminal IN2 of the final stage SRn may receive the scan start signal STV.

The first clock terminal CK1 of the odd-numbered stage is connected to a first clock signal CKV, and the second clock terminal CK2 may be applied with a second clock signal CKVB having the opposite phase. The first clock terminal CK1 of the even-numbered stage is applied with the second clock signal CKVB, and the second clock terminal CK2 may be applied with the first clock signal CKV.

The voltage input terminal Vin may be applied with the low voltage Vss corresponding to the gate-off voltage, and the reset terminal RE may be connected to the transmission signal output terminal CRout of the last stage SRn.

The output terminal OUT is connected to each of the gate lines G1-Gn to transmit the gate voltage.

Referring to FIG. 21, one stage SR includes an input section 510, a pull-up driver 511, a transmission signal generator 512, an output section 513, and a pull-down driver 514, but is not limited thereto.

The input section 510 includes one transistor Tr4, the pull-up driver 511 includes two transistors Tr7 and Tr12 and two capacitors C2 and C3, the transmission signal generator 512 includes one transistor Tr15 and one capacitor C4, the output section 513 includes one transistor Tr1 and one capacitor C1, and the pull-down driver 514 includes nine transistors Tr2, Tr3, Tr5, Tr6, Tr8, Tr9, Tr10, Tr11, and Tr13.

The gate voltage output from the output terminal OUT of the stage SR is transmitted to the gate lines G1-Gn extended to the display area DA.

The transmission signal output from the transmission signal output terminal CRout of one stage SR is inputted to the first input terminal IN1 of the next stage, however, the voltage of the transmission signal may be relatively large such that the current flowing to the transmission signal output terminal CRout, the first input terminal IN1, or the first node N1 may be correspondingly large and the contact assistant may be either disconnected or at a risk of being disconnected in the connection of these portions. Accordingly, the structure of the connection according to the above-described several exemplary embodiments is applied to the transmission signal output terminal CRout or the first input terminal IN1, thereby reducing a likelihood of defect of the connection and the defect of the scan driver 400.

Although FIG. 18 and FIG. 19 show a liquid crystal display panel, exemplary embodiments of the present invention may be utilized in any type of display panel, such as, for example, a plasma display panel, an organic light emitting diode display panel, an electrophoretic display panel, etc. Further, although FIG. 20 and FIG. 21 show a gate driver, exemplary embodiments of the present invention may be utilized in other drivers, such as a data driver. Furthermore, exemplary embodiments of the present invention may be utilized in any device having an electrical connection between two conductive layers.

Also, in the circuit diagram of FIG. 21, the second node N2 is a node that may be connected to a large amount of transistors or capacitors such that the large current may flow. Accordingly, the connection connected to the second node N2 may be applied with the structure of the connection according to an exemplary embodiment of the present invention such that the likelihood of defect of the scan driver 400 may be reduced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
a substrate;
a first conductive layer disposed on the substrate and comprising a first terminal;
a first insulating layer disposed on the first conductive layer;
a second conductive layer disposed on the first insulating layer and comprising a second terminal;
a second insulating layer disposed on the second conductive layer;
a profile relieving member disposed on the second insulating layer and having an island shape limited on and around at least one of the first terminal and the second terminal; and
a contact assistant disposed on the profile relieving member,
wherein the profile relieving member covers at least a portion of an edge of the at least one of the first terminal and the second terminal.

2. The display device of claim 1, wherein:
the substrate comprises:
a display area in which a plurality of pixels are disposed; and
a peripheral area outside the display area;
a color filter comprising a first material is disposed in the display area; and
the profile relieving member comprises the first material.

3. The display device of claim 2, wherein a first distance between an edge of the profile relieving member and an edge of the first terminal is at least 10 μm and a second distance between the edge of the profile relieving member and an edge of the second terminal is at least 10 μm.

4. The display device of claim 3, wherein a third distance between two neighboring, and non-intersecting edges of the profile relieving member is at least 50 μm.

5. The display device of claim 4, wherein:
both the first insulating layer and the second insulating layer comprise at least one first contact hole exposing the first terminal;
the second insulating layer comprises at least one second contact hole exposing the second terminal; and
the profile relieving member comprises one or more openings, at least a portion of the first contact hole or the second contact hole being disposed inside the one or more openings.

6. The display device of claim 5, wherein:
the one or more opening is in plurality; and
a fourth distance between edges of adjacent openings of the plurality of openings is at least 50 μm.

7. The display device of claim 5, wherein a fourth distance between an outer edge of one of the one or more openings and an outer edge of the profile relieving member is at least 50 μm.

8. The display device of claim 5, further comprising:
a driver integrated on the substrate,
wherein the contact assistant is comprised in the driver.

9. The display device of claim 1, wherein a first distance between an edge of the profile relieving member and an edge of the first terminal is at least 10 μm and a second distance between the edge of the profile relieving member and an edge of the second terminal is at least 10 μm.

10. The display device of claim 9, wherein a third distance between two neighboring, and non-intersecting edges of the profile relieving member is at least 50 μm.

11. The display device of claim 10, wherein:
both the first insulating layer and the second insulating layer comprise at least one first contact hole exposing the first terminal;
the second insulating layer comprises at least one second contact hole exposing the second terminal; and
the profile relieving member comprises one or more openings, at least a portion of the first contact hole or the second contact hole being disposed inside the one or more openings.

12. The display device of claim 11, wherein:
the one or more opening is in plurality; and
a fourth distance between edges of adjacent openings of the plurality of openings is at least 50 μm.

13. The display device of claim 11, wherein a fourth distance between an outer edge of one of the one or more openings and an outer edge of the profile relieving member is at least 50 μm.

14. The display device of claim 1, wherein a distance between two neighboring, and non-intersecting edges of the profile relieving member is at least 50 μm.

15. The display device of claim 14, wherein:
both the first insulating layer and the second insulating layer comprise at least one first contact hole exposing the first terminal;
the second insulating layer comprises at least one second contact hole exposing the second terminal; and
the profile relieving member comprises one or more openings, at least a portion of the first contact hole or the second contact hole being disposed inside the one or more openings.

16. The display device of claim 15, wherein:
the one or more opening is in plurality; and
a fourth distance between edges of adjacent openings of the plurality of openings is at least 50 μm.

17. The display device of claim 15, wherein a fourth distance between an outer edge of one of the one or more openings and an outer edge of the profile relieving member is at least 50 μm.

18. The display device of claim 1, wherein:
both the first insulating layer and the second insulating layer comprise at least one first contact hole exposing the first terminal;
the second insulating layer comprises at least one second contact hole exposing the second terminal; and the profile relieving member comprises one or more openings, at least a portion of the first contact hole or the second contact hole being disposed inside the openings.

19. The display device of claim 1, further comprising:
a driver integrated on the substrate,
wherein the contact assistant is comprised in the driver.

20. The display device of claim 1, wherein:
the substrate comprises:
   a display area in which a plurality of pixels are disposed; and
   a peripheral area outside the display area;
a light blocking member comprising a first material is disposed in the display area; and
the profile relieving member comprises the first material.

21. The display device of claim 1, further comprising:
a third insulating layer disposed between the profile relieving member and the contact assistant.

22. A display device, comprising:
a substrate;
a gate layer disposed on the substrate and comprising a gate terminal;
a gate insulating layer disposed on the gate layer;
a data layer disposed on the gate layer and comprising a data terminal;
a lower passivation layer disposed on the data layer;
a profile relieving member disposed on the lower passivation layer and having an island shape limited on and around at least one of the gate terminal and the data terminal; and
a contact assistant disposed on the profile relieving member,
wherein the profile relieving member covers an edge of the gate terminal and an edge of the data terminal.

* * * * *